United States Patent [19]
Takahashi et al.

[11] Patent Number: 5,215,623
[45] Date of Patent: Jun. 1, 1993

[54] BLANKING APERTURE ARRAY AND METHOD OF PRODUCING SAME

[75] Inventors: Yasushi Takahashi, Kawasaki; Tomiyasu Saito, Yokohama, both of Japan

[73] Assignee: Fujitsu Limited, Kawasaki, Japan

[21] Appl. No.: 685,678

[22] Filed: Apr. 16, 1991

[30] Foreign Application Priority Data

Apr. 16, 1990 [JP] Japan .................... 2-097715

[51] Int. Cl.⁵ .................. H01L 21/306; B44C 1/22; C03C 15/00; C23F 1/00
[52] U.S. Cl. ......................... 156/644; 156/643; 156/653; 156/656; 156/657; 156/659.1; 156/662; 156/345; 219/121.12; 257/618; 428/137; 430/5; 437/203; 437/228; 437/238; 437/245
[58] Field of Search ............... 156/643, 644, 646, 653, 156/656, 657, 659.1, 662, 345; 437/203, 228, 238, 245; 430/5, 296; 357/65, 55, 71; 428/131, 137; 250/492.3, 427; 219/121.12, 121.26, 121.4, 121.41

[56] References Cited

U.S. PATENT DOCUMENTS

| | | | |
|---|---|---|---|
| 3,447,984 | 6/1969 | Castrucci et al. | 156/644 |
| 4,021,276 | 5/1977 | Cho et al. | 156/644 |
| 4,417,946 | 11/1983 | Bohlen et al. | 156/643 |
| 4,589,952 | 5/1986 | Behringer et al. | 156/628 |

FOREIGN PATENT DOCUMENTS

0335711 10/1988 European Pat. Off. .
0404608 12/1990 European Pat. Off. .
60-81750 5/1985 Japan .

OTHER PUBLICATIONS

Patent Abstracts of Japan, vol. 9, No. 219 (M-4101)[1942], Sep. 6, 1985; & JP-A-60 081 750 (Nippon Denki) Sep. 5, 1985.
Patent Abstracts of Japan, vol. 9, No. 219 (M-410)[1942], Sep 6, 1985; & JP-A-60 081 751 (Nippon Denki K.K.) Sep. 5, 1985.
Microelectric Engineering, vol. 9, No. 1-4, May 1989, Amsterdam, NL, pp. 205-208; U. Schnakenberg et al.: "Multi Electron Beam Lithography: Fabrication of a Control Unit".

Primary Examiner—William A. Powell
Attorney, Agent, or Firm—Staas & Halsey

[57] ABSTRACT

A blanking aperture array for use in an electron beam exposure system and a method of producing the same. An electrode layer is formed on a substrate having shift register devices, and then an electron beam aperture is formed, extending as an aligned aperture and associated opening through the substrate and electrode layer, respectively, to thereby effectively form a deep electron beam aperture.

16 Claims, 12 Drawing Sheets

BLANKING APERTURE ARRAY AND METHOD OF PRODUCING SAME

BACKGROUND OF THE INVENTION

1. Field of the Invention

The present invention relates to a blanking aperture array for an electron beam exposure system and to a method of producing the blanking aperture array and, more particularly, to an improved method of producing electrodes in the blanking aperture array.

2. Description of the Related Art

The electron beam exposure systems include a point beam type in which the electron beam is used in the form of a spot, a variable rectangular beam type in which the electron beam is used in the form of a rectangle, the size of which is variable, and a stencil mask type in which a stencil having electron beam apertures formed therein in a desired pattern is used to shape the electron beam in a desired form.

The point beam type exposure system is suitable for forming a fine pattern, but since the throughput thereof is very low, this system is used only for research and development. The variable rectangular beam type exposure system has a throughput one or two degrees higher (i.e., one or two orders of magnitude greater) than that of the point beam type exposure system, but when patterns as fine as 0.1 μm or at a high density are exposed to an electron beam, the throughput of this variable rectangular beam type exposure system is also low. When a 1-GB DRAM is exposed to the electron beam by this exposure system, the throughput becomes about three degrees less.

Methods by which all patterns can be exposed to the electron beam have been proposed; an exposure method using a two-dimensional blanking aperture array is one of these methods and is disclosed in Japanese Examined Utility Model Publication Sho 56-19402, the named applicants and assignee thereof being the common assignee herein.

The exposure system which implements the above-referenced method of electron beam exposure by the two-dimensional blanking aperture array is schematically shown in FIG. 1. In this electron beam exposure system, the electron beam emitted from an electron gun 51 is shaped into a one-shot beam (as shown by reference numeral 17 in FIG. 3), and thereafter, the beam is passed through lenses 53 and 55 and then projected upon a (BAA) blanking aperture array. The electron beam is deflected by deflectors 56 to select an area on the BAA 57 (such an area is identified by the reference numeral 17 in FIG. 3 in which the BAA is identified by numeral 18, corresponding to BAA 57 in FIG. 1) upon which the electron beam is to be projected. The electron beam, after passing through an aperture in the BAA 57, is passed through lenses 58 and 60, an aperture 61 and lenses 62 and 65, and is deflected by deflectors 63 and 64 and projected onto a selected position on a samples. A pair of blanking electrodes 59 are provided to deflect the electron beam so that it does not pass through the aperture 61.

Namely, in the two-dimensional blanking aperture array, multiple apertures for the passage of the electron beam are two-dimensionally formed in a semiconductor crystal substrate made of silicon or the like, a pair of blanking electrodes are disposed at respective opposite ends of each aperture, and pattern data is supplied defining whether or not a voltage is to be applied across the electrodes. The electron beam, after passing through the aperture is deflected or allowed to pass linearly by and independently, whereby it is determined whether or not the beam finally arrives at the sample. For example, when one of the blanking electrodes of each aperture is connected to the ground potential and a voltage is applied to the other electrode, the electron beam passing between the electrodes is deflected and is cut off by the aperture after passing through the lenses (at the reference numerals 58 and 60 in FIG. 1) located below the blanking aperture array, and thus the electron beam is not made incident on the sample surface. If no voltage is applied to the other electrode, the electron beam passing between the electrodes is not deflected, and thus the beam is not be cut off by the aperture after passing through the lenses provided below the blanking aperture array, and is projected onto the surface of samples.

Also the information carried by the pattern for each aperture (whether or not the electron beam passing through the aperture is to be deflected) is sequentially transmitted by shift registers, formed in the aperture array, selectively to the apertures. For this purpose, devices and wires must be accommodated to form the shift registers.

FIG. 2 is a schematic diagram of a two-dimensional blanking aperture array 18. As shown in the Figure, a plurality of apertures 15 is disposed two-dimensionally in the blanking aperture array, and a pair of electrodes 14A is formed at each of the apertures. Each lattice 13 is formed of wires and devices by which a voltage is applied to the electrodes of each aperture, independently, according to a given pattern data. The apertures are disposed at regularly spaced intervals of 10 μm and each is 7 μm by 7 μm in size. Also, each electrode is about 1 μm thick, 7 μm wide and 20 μm long (in the depth direction, transverse to the plane of FIG. 3).

FIG. 3 is a plan view showing an exemplary blanking aperture array 18. In this case, the blanking aperture array 18 consists of four shot areas 17 each having sixteen (4×4) apertures 15, and is controlled according to a given pattern data to determine whether or not the electron beam passing through each aperture in one shot area 17 is to be deflected (i.e., whether or not a voltage is to be applied between the electrodes of each aperture) when the beam passes through the aperture. At the other three shot areas, the beam passage is controlled according to different pattern data for the passage of the electron beam. The electron beam is deflected to each shot area by the deflector 56 in FIG. 1.

The above-mentioned two-dimensional blanking aperture array can be formed by the processes shown in FIGS. 4(1) to 4(4) and 5(1) to 5(4). As shown in FIG. 4(1), an impurity diffusion layer 12 is formed on a semiconductor substrate 10 by doping impurities, and an epitaxial growth layer 14 is grown on the impurity diffusion layer 12 as shown in FIG. 4(2). Thereafter, other devices are formed in the epitaxial growth layer 14, i.e., MOS transistors, etc., which implement an inverter and a gate.

The aperture AP with spaced sidewalls and spaced electrodes $E_1$ and $E_2$ formed on the respective aperture sidewalls, as shown in FIG. 4(4) is formed as shown in FIGS. 5(1) to 5(4).

As shown in FIG. 5(1), a narrow trench 16 is formed by trench etching at opposite sides of each aperture to be formed, extending through the epitaxial growth layer until the trench reaches the substrate 10. Next, an insulation film 18 is formed on the entire surface as shown in FIG. 5(2), and then an electrode material 20 is deposited in each trench 16 as shown in FIG. 5(3).

Next, the portions of the epitaxial growth layer 14 and the impurity diffusion layer 12 between the thus formed electrodes $E_1$ and $E_2$ are removed by etching to form the aperture AR therethrough as shown in FIG. 5(4).

Furthermore, the semiconductor substrate 10 is taper-etched between the electrodes $E_1$ and $E_2$, from the rear side thereof as shown in FIG. 4(4), whereby the completed aperture AP is formed.

The output of each of the shift register stages is connected to one of the electrodes $E_1$ and $E_2$ of each aperture, and the low voltage side GND of the power source or, alternatively, the high voltage side $V_{DD}$, is connected to the other electrode. This wiring process is effected at the same time as, or separately from, the wiring to each device of the shift register and the clock signal wiring.

FIG. 6 shows the arrangement of such a blanking aperture array circuit. As seen in the Figure, AP indicates a beam aperture, and a pair of electrodes $E_1$ and $E_2$ are formed in spaced relationship at respective, appropriate edges of each aperture. $E_1$ is an electrode to which a constant voltage is always applied, and $E_2$ is an electrode to which a voltage which is varied in accordance with the given pattern data is applied. When the electron beam is turned on, a same voltage (0V, for example) is applied to the electrodes $E_1$ and $E_2$ so that the beam passing through the aperture 61 in FIG. 1 is not deflected when passing between the electrodes, and arrives at the samples in FIG. 1. On the other hand, when the electron beam is turned off, a voltage (+5V, for example) applied to the electrode $E_2$ is different from the voltage applied to the electrode $E_1$, and thus the beam when again turned on is deflected when passing through the electrodes and is given a trajectory such that it cannot pass through the aperture 61 in FIG. 1. Thus, in the latter case, the electron beam will not arrive at the samples. The beam on/off data (0 or 5V) is transferred by the shift register, formed in the BAA, to the electrodes of each aperture. Namely, the data supplied from the left by data transfer wires $SR_1$ to $SR_3$ is shifted until it is transferred fully to the right by clock signal wires $CLK_1$ and $CLK_2$. During the data transfer, another area (at the reference numeral 17 in FIG. 3) is exposed to the deflected electron beam or a variable rectangular aperture is used. Note that "U" in FIG. 6 indicates an area where a device (as in FIG. 4(4) is formed.

As seen from the foregoing, the blanking aperture array is conventionally formed by etching a semiconductor substrate for forming electrodes, implanting electrode materials in the substrate and, thereafter, forming apertures at which the electrode surfaces are exposed.

Namely, the conventional method of forming electrodes necessitates the etching of the substrate, and the portions where the electrodes are to be formed must be etched to a greated depth than the etched area, for example, 7.0 μm (longitudinally) × 1.0 μm (laterally), and 20 to 30 μm (in depth). Since the electrode side face is formed along the etched trench wall of the substrate (in effect, an insulation layer side face is defined by the trench and then an electrode material is implanted in the trench to form the electrode side face), the etching must be linear because the electrode side face is defined by the form of the etched aperture. Also, the insulation layer must be formed to include the etched trench and the electrode material implanted in the trench, and unless the electrode material is fully buried in the trench, it cannot operate for the full length of the electrode's intended life. Accordingly, the electrode materials must be fully buried for each of the two electrodes formed in each of the apertures of the array (e.g., 200 apertures × 200 apertures ×, and this process is difficult.

It is also very difficult to form many apertures in a limited space, as each aperture must have a substantial size because of the relation with the time of exposure to the electron beam.

Furthermore, elaborate devices for the shift registers must be formed in the substrate, to prevent a malfunction of the devices due to exposure to the electron beam.

SUMMARY OF THE INVENTION

An object of the present invention is to overcome the above-mentioned drawbacks of the conventional techniques by providing an improved and novel blanking aperture array, and a method of producing the blanking aperture array.

The inventors have made intensive studies into the above-mentioned drawbacks of the conventional techniques and as a result discovered an improved and novel blanking aperture array having a structure which is different from the conventional structures.

The above object of the present invention can be attained by providing a blanking aperture array for use in an electron beam exposure system, the blanking aperture array according to the present invention comprising:

a substrate having a plurality of apertures;

a pair of electrodes disposed around each of the apertures on said substrate wherein the center line of the electrodes is coincident with the aperture.

The method of producing this novel blanking aperture array according to the present invention comprises the steps of:

forming electrode layers on a substrate;

selectively etching the electrode layers to form a plurality of openings; and forming a plurality of apertures in the substrate in such a manner that the center line of each opening coincides with each operature (i.e., is aligned with) the center line of a respective aperture.

Another method of producing the novel blanking operature array according to the present invention comprises the steps of:

forming electrode layers on a substrate;

forming a plurality of apertures in the substrate having respective center lines selectively etching the electrode layers to form a plurality of openings having respective center lines coinciding with corresponding aperture center lines.

Different from the conventional method, the method according to the present invention essentially lies in (1) forming an electrode layer in a semiconductor substrate and (2) forming an electron beam aperture in the same position through the substrate and the electrode layer.

To produce the blanking aperture array of the present invention, the method comprises the steps of forming on the substrate an insulation layer which provides isolation between an electrode material and a semiconductor substrate, as well as a device and wires for a shift register; opening an window for contact in the insulation layer; depositing the electrode material over the insulation and window portion to a desired length; removing, by etching, unnecessary portions of the electrode material; and etching the substrate, insulation layer and electrode material to form opening of the same shape therein, to thereby provide an electron beam aperture.

The removal by etching of the unnecessary portions of the electrode material may be done in an area other than the area which will be the opening, and before forming the opening as mentioned above or after forming the opening.

Also the opening can be formed by etching the substrate, insulation layer and electrode layer collectively at areas thereof corresponding to the electron beam aperture.

The opening may be formed by etching the substrate, insulation layer and then the electrode layer, in this order, from the rear side of the substrate, or etching in the reverse order from the front side. Alternatively, the opening can be formed by first etching the electrode layer and then the substrate and insulation layer, from the rear side.

Furthermore, the opening may be formed by first etching the electrode layer and insulation layer, in this order, from the front surface of the substrate, and then the substrate from the rear side thereof, or in the reverse order.

The etching involved in all the above-mentioned methods is preferably an anisotropic etching.

In the method according to the present invention, the electrodes are formed simultaneously with the forming of the opening.

Moreover, by etching the substrate, insulation layer and electrode layer collectively in one step, to form the opening, an electron beam aperture can be produced as defined by the flush end faces of the openings in the substrate, insulation layer and electrode layer.

Further, by etching in two steps as above, the end faces of the openings in the substrate, insulation layer and electrode layer can be made flush with each other as above, or the end face of the opening in the electrode layer may be set back from those of the openings in the substrate and insulation layer. In the latter case, the etching need not be so precise and may be rough, because the opening in the substrate is used only to shape the electron beam. Namely, the opening wall of the electrodes does not have a close relation with the extent of the electron beam deflection.

When the end face of the opening in the electrode layer is set back from the openings in the substrate and insulation layer, the set-back portion can be used as a positioning margin for forming the electrodes at the surface by making the openings from the rear side of the substrate.

In the method according to the present invention, the electrodes are formed by depositing an electrode material on the insulation layer. The electrode material is deposited by coating in a conventional manner, but a plating method may be adopted to deposit the electrode material on an electrode metal to be plated.

Further, in the method according to the present invention, a window for contact is opened in the insulation layer corresponding to a device area formed in the substrate, in such a manner that the device area is positioned under the electrode.

BRIEF DESCRIPTION OF THE DRAWINGS

The object as well as advantages of the present invention will be made clear by the following description of the preferred embodiments of the present invention, with reference to the accompanying drawings, wherein.

DESCRIPTION OF THE PREFERRED EMBODIMENTS

Embodiment 1

Figure 7:
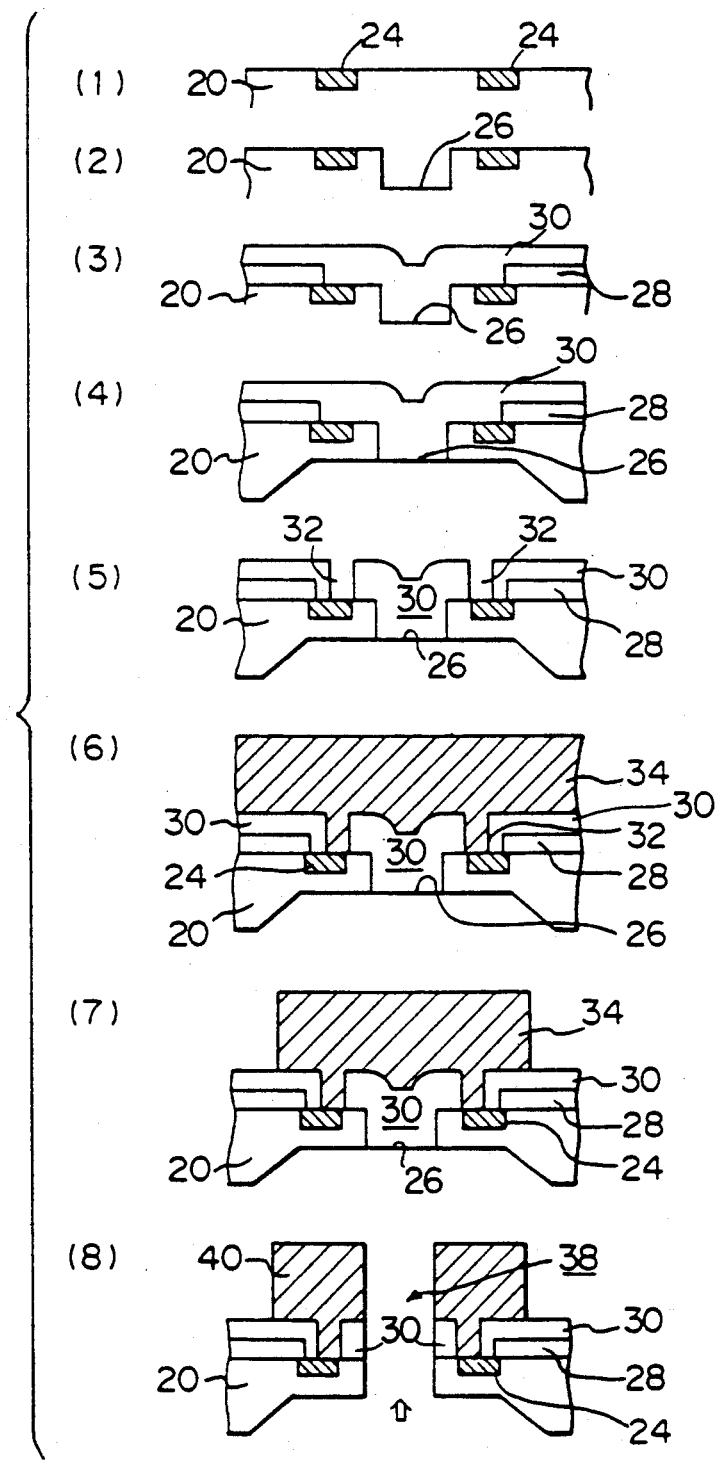
FIG. 7 is a process drawing of steps (1) to (8) showing one embodiment of the present invention.

FIG. 7 in steps (1) to (8), shows the processes of producing the electrodes according to one embodiment of the present invention.

Devices for shift registers 24 (referred to as "device" or "devices" hereinafter) are formed on a silicon substrate 20 (at step (1) in FIG. 7). Next, a silicon oxide film ($SiO_2$) is deposited over the silicon substrate 20, patterned and used as mask to form, by etching, $7 \times 7$ μm trenches in the substrate at the area which will be an opening 26 (at step (2) in FIG. 7). Further, an insulation layer is formed on the entire surface, a window for contact with the device 24 is opened by patterning, and a wiring material (W or the like) is deposited on the entire surface. The wiring material is patterned to form a wire 28 and another insulation film 30 is formed on the entire surface (at step (3) in FIG. 7). The insulation film 30 may be made of $SiO_2$ and formed by CVD. The insulation film (oxide film) 30 becomes an insulation layer for separating the wires from each other, and therefore, the insulation film 30 need not entirely fill the opening 26.

Figure 1:
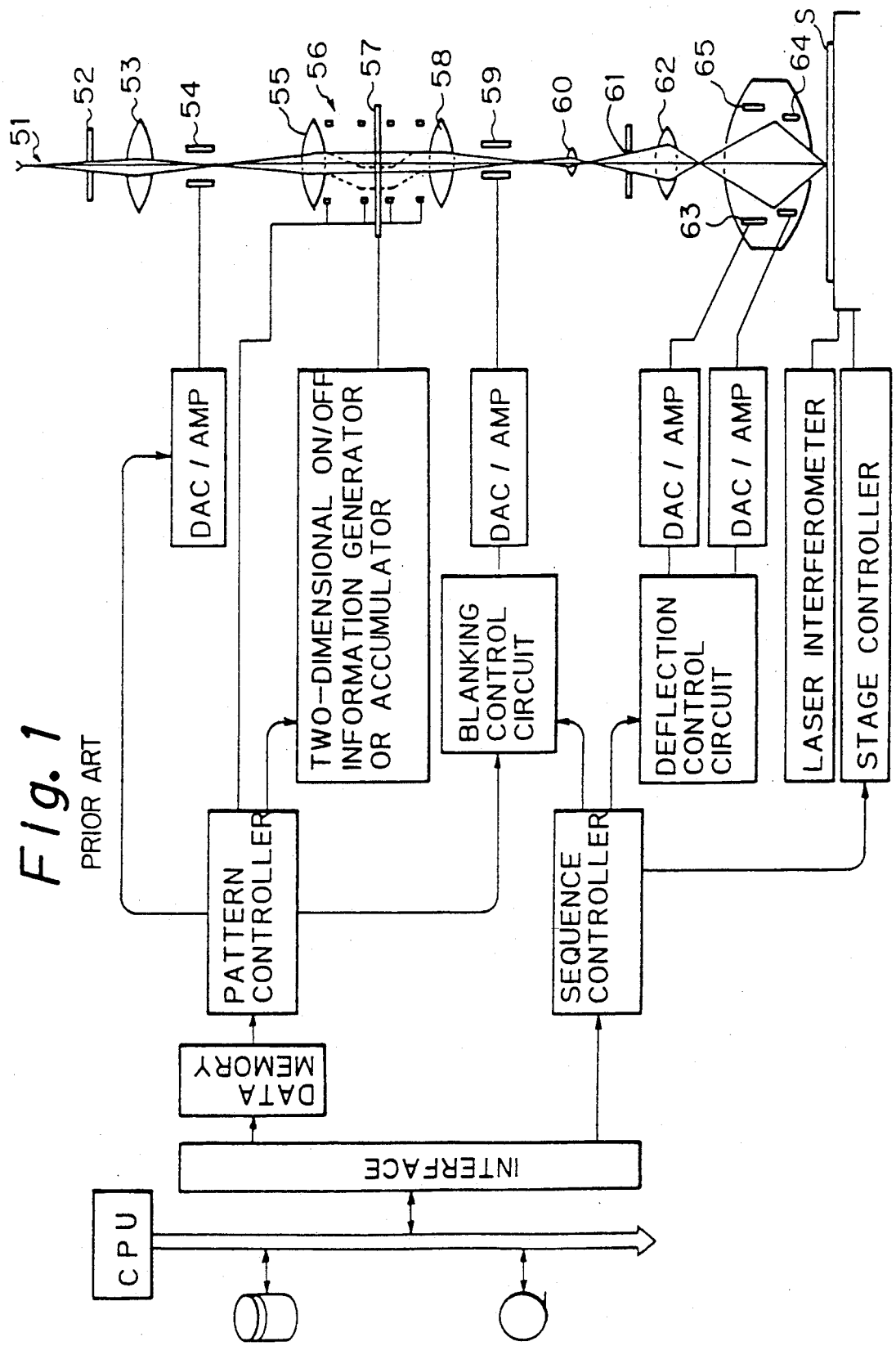
FIG. 1 is a schematic diagram of the overall construction of the electron beam exposure system.
Figure 2:
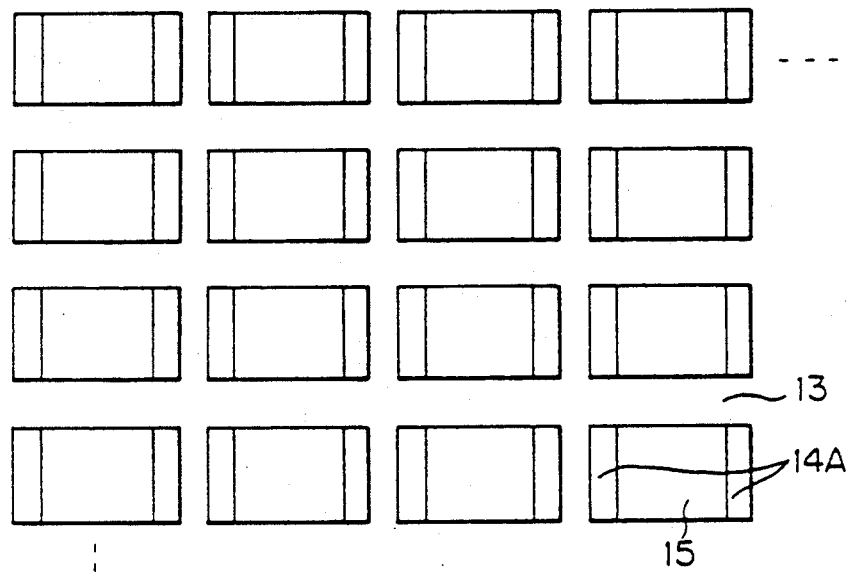
FIG. 2 is a schematic diagram of the two-dimensional aperture array.
Figure 3:
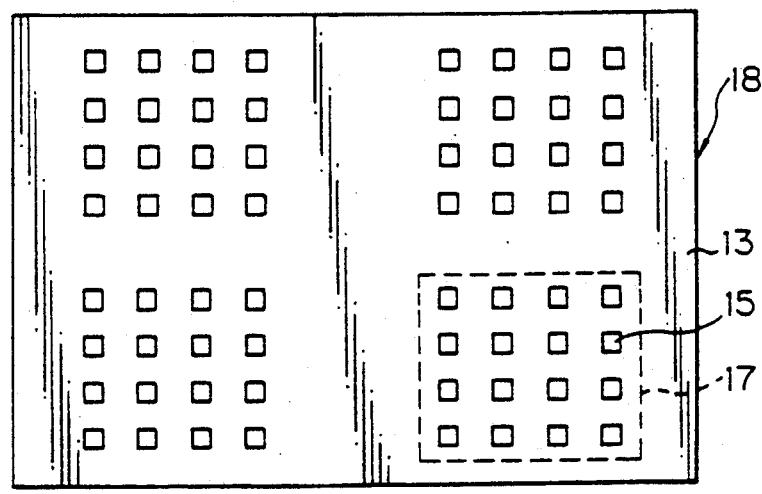
FIG. 3 is a plan view of the blanking aperture array.
Figure 4:
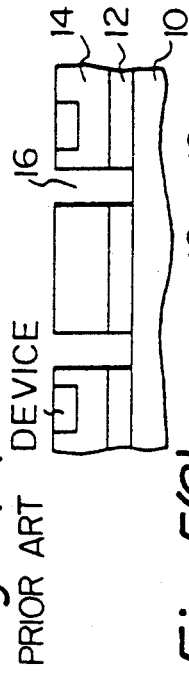
FIGS. 4(1) to 4(4) are explanatory drawings showing the process of producing the aperture array.
Figure 4:
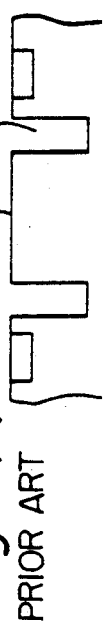
Figure 4:
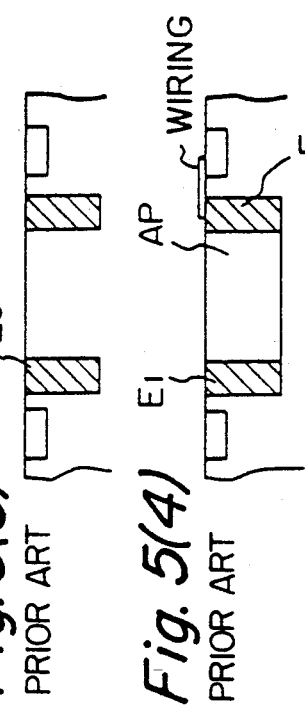
Figure 4:
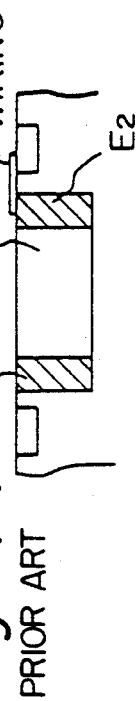
Figure 5:
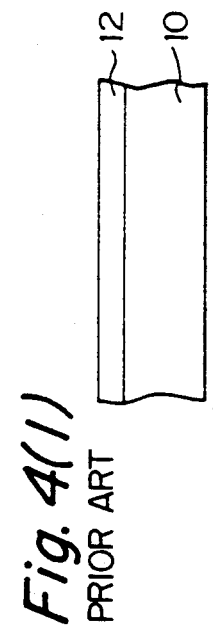
FIGS. 5(1) to 5(4) are explanatory drawings showing the process of forming the apertures.
Figure 5:
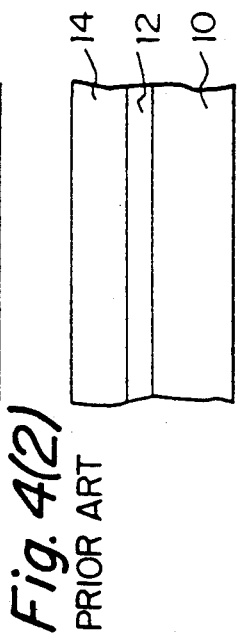
Figure 5:
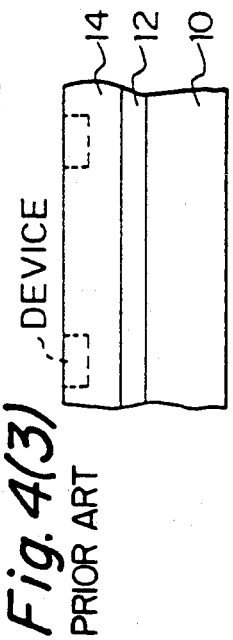
Figure 5:
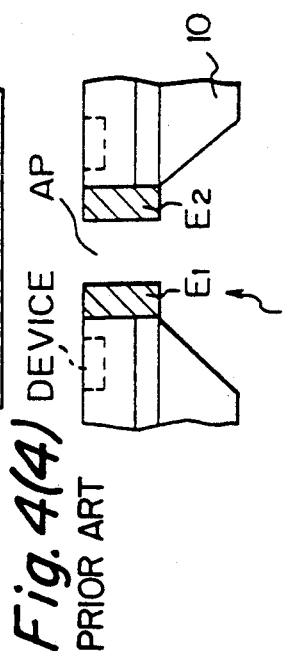
Figure 6:
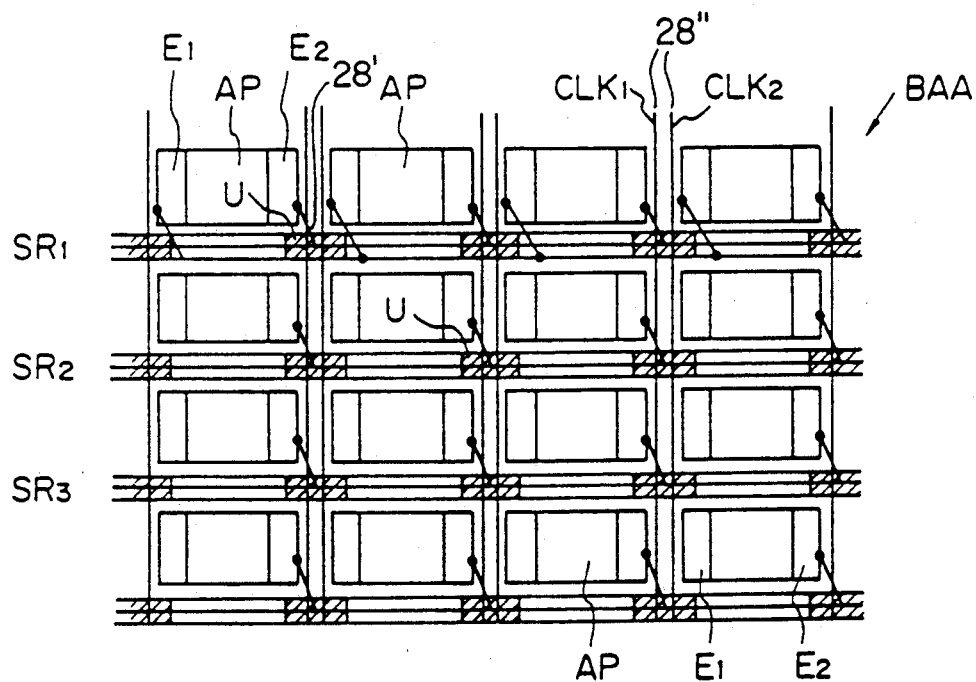
FIG. 6 is a plan view showing the arrangement of the blanking aperture array circuit.

Next, an oxide film is deposited as a mask over both the front and rear sides, a predetermined area at the rear side is patterned, the oxide film is removed, and the rear side is etched (at step (4) in FIG. 7). This etching may be a wet etching in which a KOH solution is used, but not a rough etching. Then, a window 32 is formed in the insulation film 30 (at step (5) in FIG. 7) on each of the opposite sides of the area which will be an opening 26 and such that there is exposed through each window a corresponding, underlying element, such as an electrical contact area of the shift register device 24 when formed in alignment with the opening 26 and thus also with the window 32. Alternatively, the shift register devices 24 may be offset from the opening 26 and, instead, a wire 28 may be exposed through the window 32, as illustrated in FIG. 6 for the shift register devices U relative to the apertures AP. In this case, the wire 28 exposed through the window 32 of FIG. 7 may be, as shown in FIG. 6, a wire 28' which connects an output of the shift register device U with a corresponding electrode E1 or alternatively a wire 28" on which a clock signal CLK1, CLK2 is conducted; the electrode 40 then extends through the window 32 in FIG. 7(5) to contact the wire 28. Accordingly, the window 32 may selectively expose either element, i.e., the device 24 or the wire 28. Furthermore, an electrode material (for example, W or the like) is deposited on the insulation film by sputtering (or deposition) in such a manner that a desired length of electrode can be finally assured, thereby forming an electrode material layer 34 (at step (6) in FIG. 7). Note that the electrode material may be filled in the window 32 beforehand in this case.

Further, an oxide film is deposited on the entire surface and patterned, and using the patterned oxide film as a mask, unnecessary portions of the electrode material layer 34 are removed by anisotropic etching (at step (7) in FIG. 7). Finally, the insulation film (oxide film) and electrode material layer corresponding to the opening are removed by anisotropic etching from the rear side, with the etching gas changed sequentially, to simultaneously form an electron beam aperture 38 and an electrode 40.

It should be noted that the opening 26 is formed at the beginning of the process to facilitate the positioning for etching in the subsequent processes.

More particularly, the etching involved in the above-mentioned embodiment can be done, for example, as follows:

i) Etching of electrode (W)

Since the electrode (W) is about 20 μm thick, it is etched using a CVD oxide film (2 μm) and tri-level photo-resist (lower layer about 5 μm thick) as a mask.

First, the CVD oxide film is etched, using the photo-resist as a mask, with a $CHF_3/CH_4$ gas. Next, using the remainder of the photo-resist and the CVD oxide film as a mask, the substrate is etched using an $SF_6$ gas under the low temperature.

ii) Etching of insulation film ($SiO_2$)

The insulation film is etched using a $CHF_3/CH_4$ gas. Either the W of the electrode or Si of the electrode may be used as a mask. The etching may be done from either the rear side or front side of the substrate.

iii) Etching of substrate (Si)

Using the oxide film (PSG) deposited as a mask on the rear side, the substrate is etched with an HBr gas.

Embodiment 2

The second embodiment of the method according to the present invention will be described with reference to FIG. 8 steps (1) to (7). Note that the symbols used in Fig. 8 have the same meanings as those in FIG. 7. In the description of the second embodiment, explanations of similar operations to those in the first embodiment will be simplified.

Figure 8:
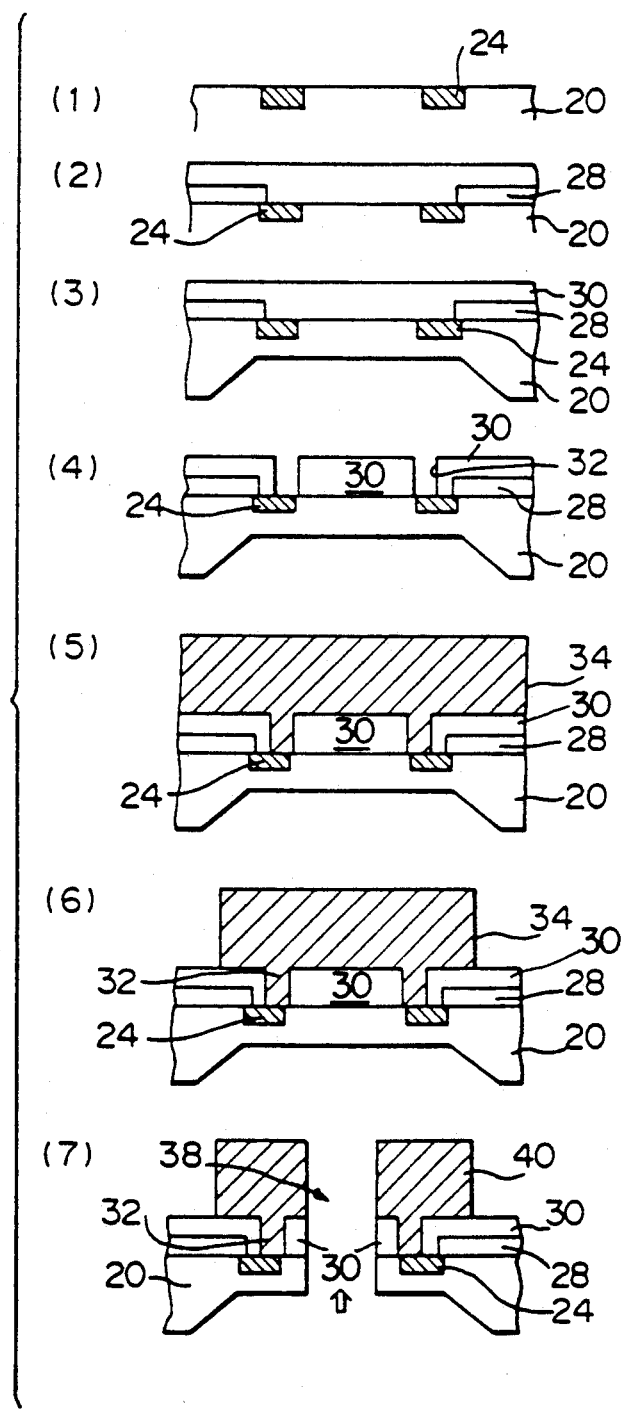
FIG. 8 is a process drawing of steps (1) to (7) showing another embodiment of the present invention.

A device 24 is formed on a substrate (silicon) 20 (at step (1) in FIG. 8), a wire (W or the like) 28 is formed on the silicon substrate 20 by patterning, and an insulation film 30 is formed on the wire (at step (2) in FIG. 8). Next, the rear side of the substrate is wet-etched to a predetermined shape by isotropic etching (at step (3) in FIG. 8). The rear side may be etched with an oxide film deposited thereon, after depositing an electrode material (W).

Next, a window 32 for contact with the electrode and device is formed on the insulation film 30 (at step (4) in FIG. 8). As at step (5) of the first embodiment, an electrode material (W or the like) is deposited to form an electrode material layer 34 (at step (5) in FIG. 8). Also in this embodiment, the W or the like may be grown in the window beforehand.

Then, an oxide film is deposited on the entire surface, patterned, and using the patterned oxide film as a mask, unnecessary portions of the electrode material layer 34 are removed by isotropic etching (at step (6) in FIG. 8).

Further, an oxide film ($SiO_2$) is deposited on the rear side of the substrate and patterned, and the portion of the layers to be opened is etched (by anisotropic etching). Next, the opened substrate (Si) 20 is masked, and the insulation film ($SiO_2$) 30 is etched (by anisotropic etching). Using the opened $SiO_2$ film 30 as a mask, the electrode material layer 34 is etched to form an electron beam aperture 38. An electrode layer 40 is formed simultaneously with the electron beam aperture (at step (7) in FIG. 8).

Embodiment 3

Figure 9:
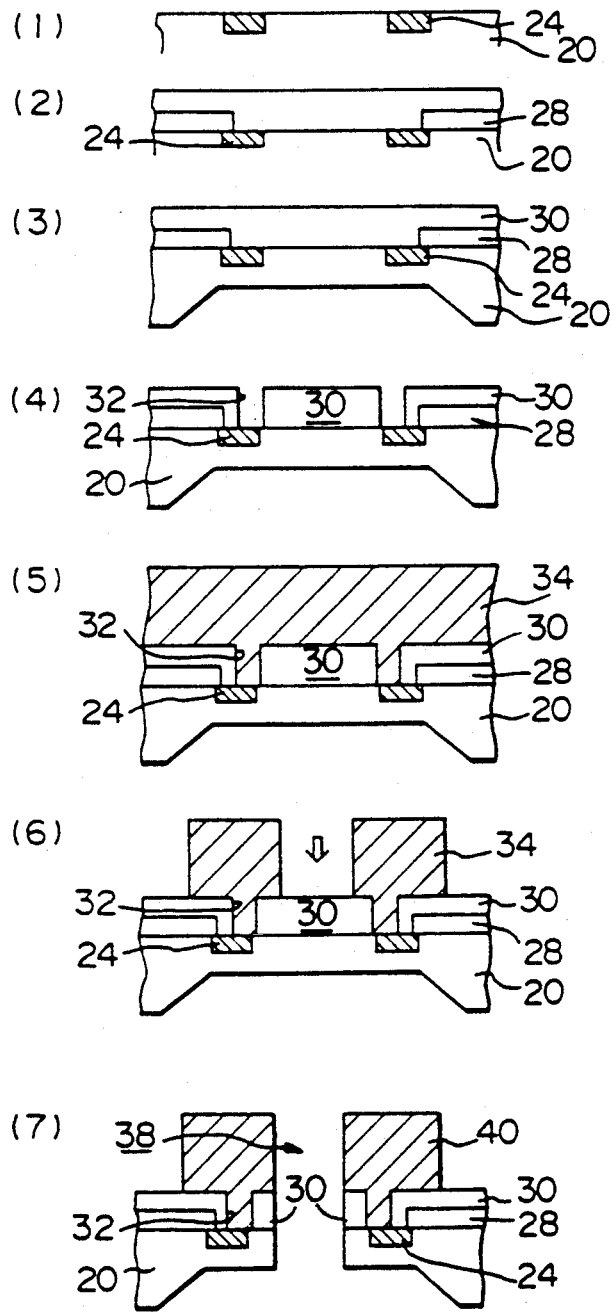
FIG. 9 is a process drawing of steps (1) to (7) showing still another embodiment of the present invention.

FIG. 9 shows a variation of the second embodiment. Since the process steps (1) to (5) in this variation are the same as those in the second embodiment, they will not be described.

The opening is formed and unnecessary portions of the electrode material layer 34 are removed, as follows. Namely, to form the opening in a linear and well-defined form, an oxide film or the like is formed on the electrode material layer 34. Next, the oxide film on a portion which is to be the opening is removed, and an etching is done through the layer 34 and to the insulation film 30 by changing the etching gas or otherwise. Thereafter, the oxide film is removed from the electrode material layer 34, and unnecessary portions are removed from the electrode material layer 34 by etching (at step (6) in FIG. 9).

Finally, the insulation film 30 and substrate 20 are etched (by anisotropic etching) from the front side of the substrate, to form an electron beam aperture 38, whereby an electrode layer 40 is formed (at step (7) in FIG. 9).

Embodiments 4 to 6

Next, the embodiments in which the electrode is set back will be described with reference to FIGS. 10 to 12 respectively showing steps (1) to (5), (1)' (5)' and (1)''' to (5)'''. Note that the symbols used in FIGS. 10 to 12 have the same meanings as those in FIG. 7. In the description of the second embodiment, explanations of operations similar to those in the first embodiment will be simplified.

The first (fourth embodiment) of these embodiments 4 to 6 will be described with reference to FIG. 10. Namely, in the fourth embodiment, the processes (1) to (5) in the second embodiment are also done at the corresponding steps (1) to (3) in FIG. 10.

Figure 10:
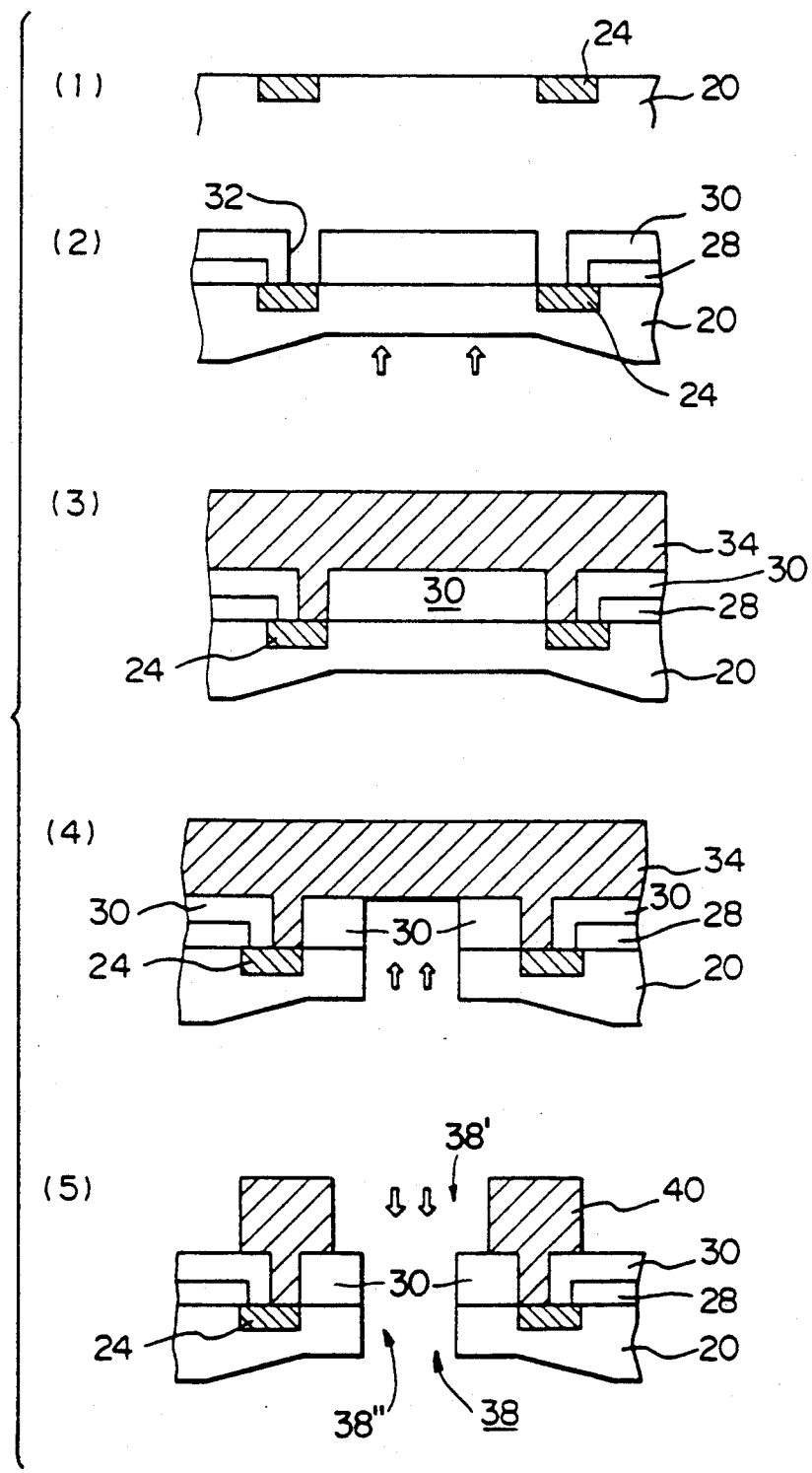
FIG. 10 is a process drawing of steps (1) to (5) showing one embodiment of the present invention in which the electrodes are retracted.
Figure 11:
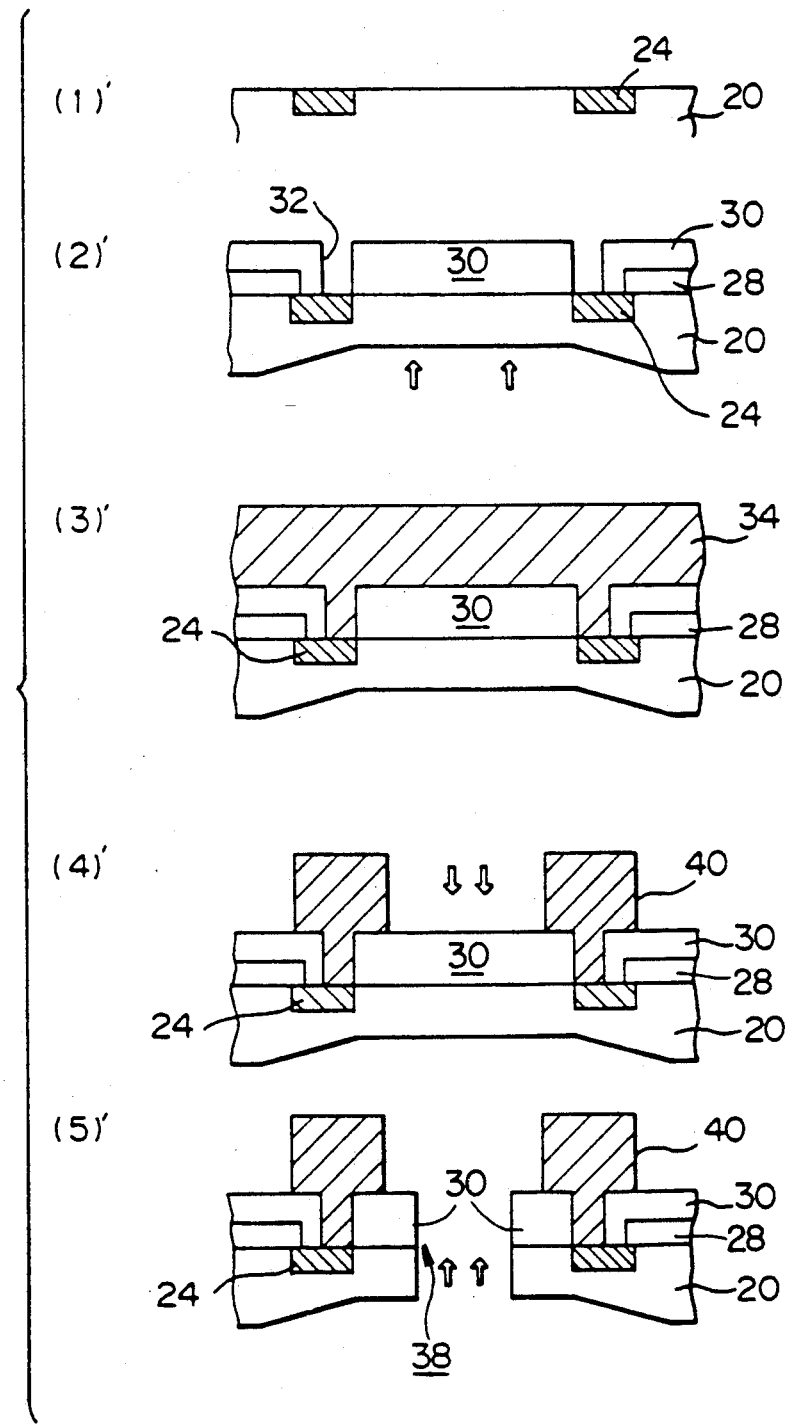
FIG. 11 is a process drawing of steps (1)' to (5)' showing another embodiment of the present invention in which the electrodes are retracted.

Next, the substrate 20 and insulation film 30 are etched (by anisotropic etching) (at step (4) in FIG. 10).

Finally, a patterning is done in such a manner that the electrode is set back, and an etching is done from the front (top) side of the substrate to form an electron beam aperture 38 and a pair of electrodes 40 (at step (5) in FIG. 10).

Note that the electron beam aperture 38 consists of an opening 38' and an aperture 38".

A next (fifth embodiment) of the above-mentioned embodiments 4–6 will be described with reference to FIG. 11. As can be seen, the production processes (1)' to (3)' in this fifth embodiment are the same as the processes (1) to (3) in the fourth embodiment.

After depositing an electrode material, a patterning is made to form the electrode 40. Next, a patterning is done such that the electrode is set back, and the insulation film 30 is etched from the front side of the substrate 20 (at step (4)' in FIG. 11). Then, etching is effected from the rear side of the substrate 20 to form an electron beam aperture 38 in an aligned position (at step (5)' in FIG. 11).

A further (sixth embodiment) of the aforementioned embodiments will be described with reference to FIG. 12. As can be seen, the steps (1)" and (2)" in this sixth embodiment are the same as the processes (1) to (3) in the first and second embodiments.

Figure 12:
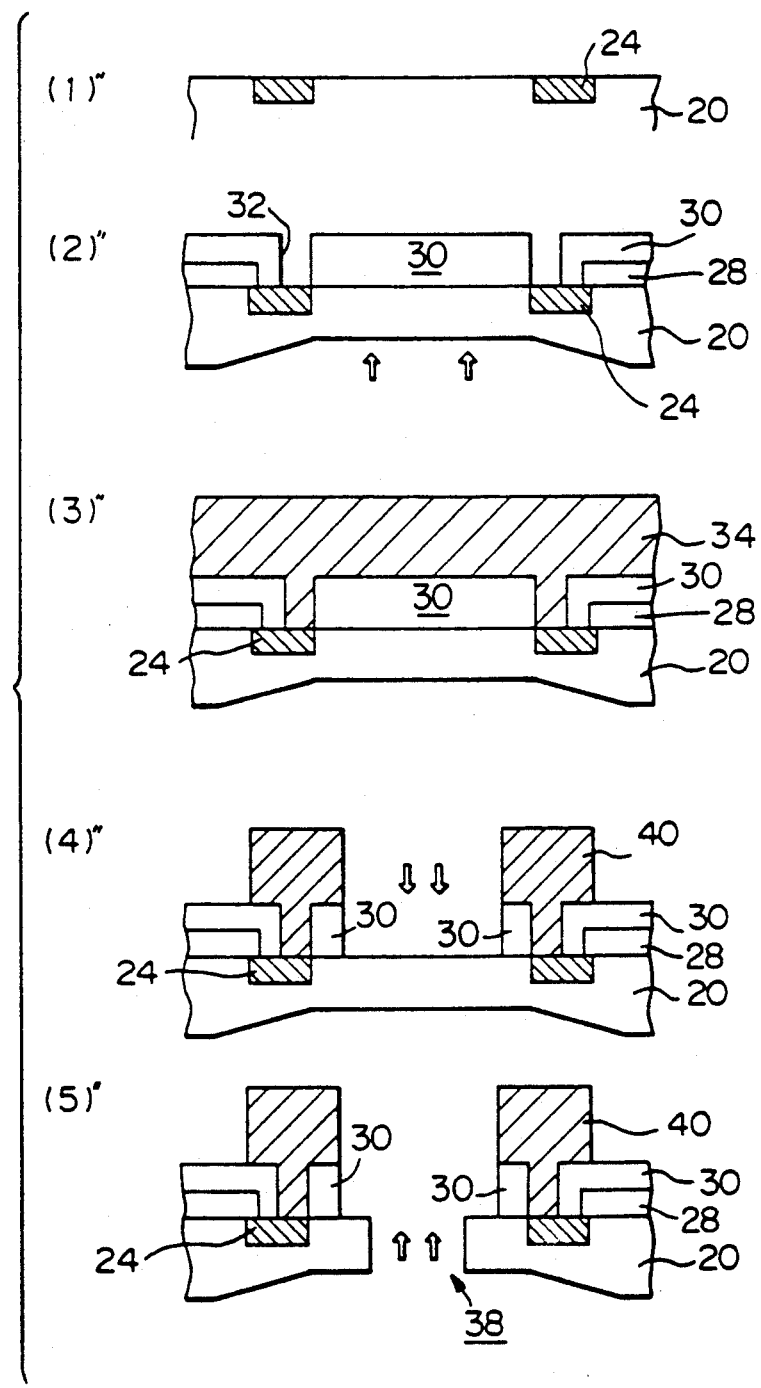
FIG. 12 is a process drawing of steps (1)'' to (5)'' showing still another embodiment of the present invention in which the electrodes are retracted.

After depositing an electrode material, a patterning is done to form the electrode 40, and then the insulation film 30 is etched, with the etching gas changed, to form a trench in the insulation film 30 (at step (4)" in FIG. 12). Next, a patterning of the substrate 20 is done for a smaller area (seen as narrower, in the two-dimensional view of FIG. 12, step (5)") than the trench, and an etching is done from the rear side of the substrate 20 to form a electron beam aperture 38.

Embodiment 7

Figure 13:
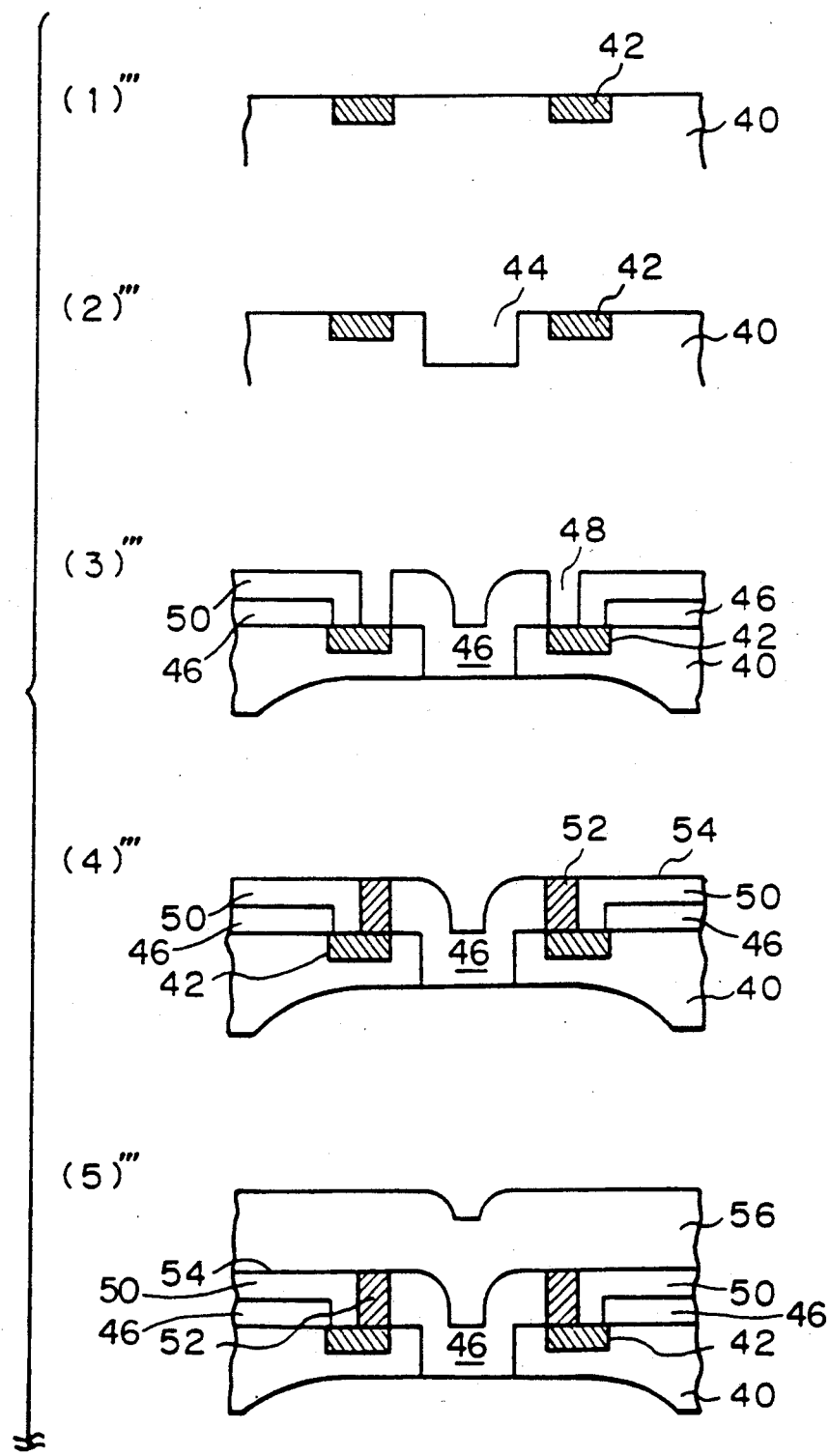
FIG. 13 is a process drawing of steps (1)''' to (10)''' showing another embodiment of the present invention, in which the electrode is formed by a plating method.
Figure 13:
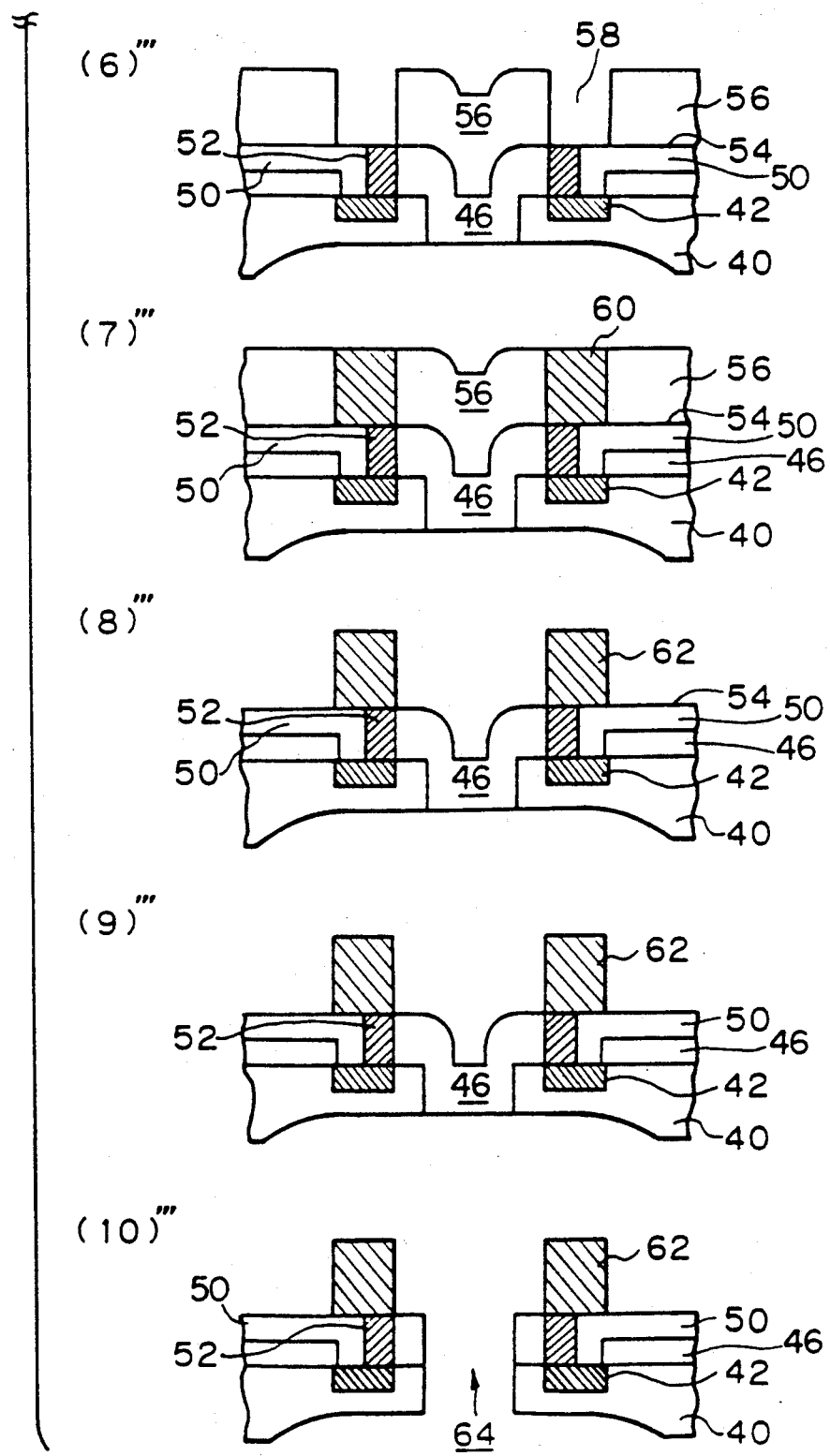

FIG. 13 shows, in steps (1)''' to (10)''' a further embodiment of the present invention. In this embodiment, a pair of electrodes are formed by a plating method. These electrodes are not formed at the same time as the etching but when plating.

First, devices for shift register 42 are formed on a silicone substrate 40 (at step (1)''' in FIG. 13), then an opening 44 is formed in the substrate (at step (2)''' in FIG. 13), an insulating film 46 is formed on the substrate, a window 48 for contact with the device 42 is opened by etching, and a wire pattern 50 is formed on the insulating film 46 (at step (3)''' in FIG. 13). A material 52 for forming an electrode is grown in the window, and a metallic wire 54 for the plating step is formed on the surface, of the substrate and in contact with the material for 52 of the electrode (at step (4)''' in FIG. 13).

Next, a resist 56 is coated to a large thickness corresponding to the thickness of the electrode (at step (5)''' in FIG. 13), and openings 58 for forming the electrode are formed by a patterning process (at step (6)''' in FIG. 13).

Next, the device is dipped in a plating bath, to obtain the material for the electrode plate while applying an electric current to the metallic wire 54 for the plating step, and the portion 60 corresponding to the electrode is formed (at step (7)''' in FIG. 13).

Next, the resist is removed to form a pair of electrodes 62 (at step (8)''' in FIG. 13).

Finally, the metallic wire for the plating step is removed (at step (9)''' in FIG. 13), followed by etching the substrate 40 and a portion of layer 46, to obtain an electron beam aperture (at step (10)''' in FIG. 13).

As described above, according to the present invention, the electrode is not formed on the lateral side of the substrate but on the surface of substrate, and an electron beam aperture is formed in a common, or aligned, position through the substrate and through the electrode layer. Therefore, a deep electron beam aperture can be formed with high efficiency.

Also, since unnecessary portions of an electrode material deposited on the substrate are removed by anisotropic etching, it is not necessary to form in the substrate, by etching, a trench where an electrode is to be formed and having a small area but a large depth. Further, since it is unnecessary to form an insulation layer on the wall face of the thus formed trench, as in the conventional technique, and to fill an electrode material in the trench, the electrode can be easily formed. Furthermore, unnecessary portions of the electrode material can be removed from an area other than an area which is to be opened, before or after the substrate, insulation film and electrode material are etched collectively at one step in a common aligned position to form the opening, whereby a linear electron beam aperture can be formed without any deviation between the openings in the substrate and electrode material.

Also, when building the device in the substrate, the device can be placed in an area under the electrode because of the geometrical relation thereof to the area to be opened. Namely, the device can be hidden behind the electrode, and thus a possible malfunction of the device due to exposure to the electron beam can be avoided. Furthermore, since the electrode is formed on the surface, the device also can be formed under the electrode, with the result that the lattice portion of the substrate can be made larger, leading to an improved strength of the substrate, and that the device area and electrode area can overlap each other, leading to an easy forming of the device.

Further, by etching with the patterning position changed, a blanking aperture array can be provided in which the electrode is set back from the opening position. In this case, the electron beam may be shaped through the opening in the substrate. Therefore, a high precision blanking aperture array can be produced by a rough etching, without considering the shape of the electrode surface.

We claim:

1. A blanking aperture array for use in an electron beam exposure system, comprising:

a substrate having first and second, opposed main surfaces and a plurality of apertures extending through the substrate, each aperture having a pair of spaced, opposed edge faces transverse to the main surfaces of the substrate; and a plurality of pairs of electrodes formed on the first main surface of the substrate and respectively associated with said plurality of apertures in the substrate, each pair of electrodes defining a corresponding pair of spaced, opposed edge faces defining an opening therebetween aligned with the respectively associated aperture in the substrate.

2. A blanking aperture array according to claim 1, which further comprises a shift register having plural stages formed in the substrate, each stage positioned adjacent to but displaced from a corresponding aperture in the substrate and contacted by and thereby electrically connected to a corresponding electrode of the pair of electrodes respectively associated with the corresponding aperture.

3. A blanking aperture array according to claim 1, wherein the opening, defined by the opposed faces of each pair of electrodes, and the opposed edge faces of the corresponding aperture are aligned.

4. A blanking aperture array according to claim 1, wherein the shape of each opening is same as the shape of the corresponding aperture.

5. A blanking aperture array according to claim 1, wherein the size of each opening is larger than the size of the corresponding aperture.

6. A method of producing a blanking aperture array through which electron beams are transmitted, comprising the steps of:
   forming an electrode layer on a substrate;
   selectively etching the electrode layer to form a plurality of openings; and
   forming a plurality of apertures in the substrate in such a manner that the center line of each opening coincides with each aperture.

7. A method of producing a blanking aperture array through which an electron beam is to be selectively transmitted, comprising the steps of:
   forming an electrode layer on a substrate;
   forming a plurality of apertures in the substrate; and
   selectively etching the electrode layer to form a plurality of openings therein, each opening aligned with a respective aperture.

8. A method according to claim 7, further comprising the steps of:
   forming a plurality of elements in the substrate;
   selectively opening windows in the insulation layer thereby to expose through each window a surface portion of a respectively corresponding element; and
   depositing the electrode layer on the insulation layer in a thickness corresponding to a desired electrode length and with the electrode layer extending into and though each window and thereby into contact with the corresponding element exposed therethrough.

9. A method according to claim 6, comprising the steps of:
   forming a plurality of elements in the substrate;
   selectively opening windows in the insulation layer thereby to expose through each window a surface portion of a respectively corresponding element; and
   depositing the electrode layer on the insulation layer in a thickness corresponding to a desired electrode length and with the electrode layer extending into and through each window and thereby into contact with the corresponding element exposed therethrough.

10. A method according to claim 9, wherein the plurality of elements formed in the substrate include plural shift register devices and plural wires and the windows are opened in the insulation layer to expose therethrough, selectively, respectively corresponding ones of the plural shift register devices and wires formed in the substrate.

11. A method according to claim 8, wherein the plurality of elements formed in the substrate include plural shift register devices and plural wires and the windows are opened in the insulation layer to expose therethrough, selectively, respectively corresponding ones of the plural shift register devices and wires formed in the substrate.

12. A method according to claim 6, wherein the step of selectively etching the electrode layer forms a pair of spaced electrodes associated with, and at respective opposite sides of, each opening simultaneously with the forming of the associated opening.

13. A method according to claim 7, wherein the step of selectively etching the electrode layer forms a pair of spaced electrodes associated with, and at respective opposite sides of, each opening simultaneously with the forming of the associated opening.

14. A method of producing a blanking aperture array, comprising the steps of:
    forming an insulation layer on a substrate;
    forming a pair of openings in the insulation layer;
    forming a pair of electrodes in the openings, by plating;
    removing the insulation layer, and
    forming an aperture in the substrate, between the pair of electrodes and with the center line of said aperture coinciding with the center line of said pair of electrodes.

15. A blanking aperture array according to claim 1, further comprising:
    an insulating layer formed on the first main surface of the substrate and having a plurality of pairs of windows therein respectively associated with said plurality of apertures, the windows of each pair being separated by a greater distance than the separation between the spaced, opposed edge faces of the respectively associated aperture and being displaced from the corresponding spaced, opposed edge faces of the respectively associated aperture, each window exposing a corresponding portion of the first main surface of the substrate therethrough; and
    said plurality of pairs of electrodes is respectively associated with said plurality of pairs of windows, each electrode of each pair comprising a first electrode portion formed within and extending through the respective window to the first main surface of the substrate and a second electrode portion integral with the first electrode portion and formed on the insulating layer.

16. A method of producing a blanking aperture array in a substrate, through the apertures of which an electron beam is to be selectively transmitted, comprising the steps of:
    forming an electrode layer on the substrate;
    selectively etching the electrode layer to form a plurality of openings therein; and
    forming a plurality of apertures in the substrate in such a manner that each opening is aligned with a respective aperture.

* * * * *

UNITED STATES PATENT AND TRADEMARK OFFICE
CERTIFICATE OF CORRECTION

PATENT NO. : 5,215,623
DATED : June 1, 1993
INVENTOR(S) : TAKAHASHI et al.

It is certified that error appears in the above-indentified patent and that said Letters Patent is hereby corrected as shown below:

Col. 1, line 66, after "respective" insert --,--.

Col. 2, line 16, delete "be";
line 18, change "samples" to --sample S--.

Col. 4, line 26, after "and" (first occurrence) insert --,-- and after "result" insert --,--;
line 46, delete "each operature".
line 53, after "center lines" insert --; and--.

Col. 6, line 29, change "(10)''''" to --(5)'''--.

Col. 8, line 56, after "(1)'" insert --to--.

Col. 9, line 51, delete ",";
line 65, after "wire" insert --54--.

Col. 10, line 32, change "the surface" to --the substrate surface--.

Signed and Sealed this

Nineteenth Day of July, 1994

Attest:

BRUCE LEHMAN

*Attesting Officer*   *Commissioner of Patents and Trademarks*